United States Patent [19]
Kim

[11] Patent Number: 5,623,218
[45] Date of Patent: Apr. 22, 1997

[54] ADDRESS TRANSITION SIGNAL DETECTING CIRCUIT

[75] Inventor: Doe-Cook Kim, Daeku-si, Rep. of Korea

[73] Assignee: LG Semicon Co., Ltd., Chungcheongbuk-do, Rep. of Korea

[21] Appl. No.: 499,992

[22] Filed: Jul. 10, 1995

[51] Int. Cl.$^6$ ........................................ H03K 5/19
[52] U.S. Cl. ........................ 327/18; 327/142; 327/335
[58] Field of Search ............................... 327/18, 142, 335

[56] References Cited

U.S. PATENT DOCUMENTS

| | | | |
|---|---|---|---|
| 4,563,599 | 1/1986 | Donoghue et al. | 307/448 |
| 4,592,028 | 5/1986 | Konishi | 365/230 |
| 5,399,911 | 3/1995 | Tarricone | 327/18 |

Primary Examiner—Margaret Rose Wambach
Attorney, Agent, or Firm—Morgan, Lewis and Bockius LLP

[57] ABSTRACT

An address transition signal detecting circuit includes a differentiator for receiving and differentiating an address input signal, and a pulse signal forming portion for receiving the signal differentiated in the differentiator to thereby form an address transition signal.

20 Claims, 3 Drawing Sheets

Ai: address input signal
Ai'D, Ai', AiD: derivative signals
TAi: address transition signal FIG. 5
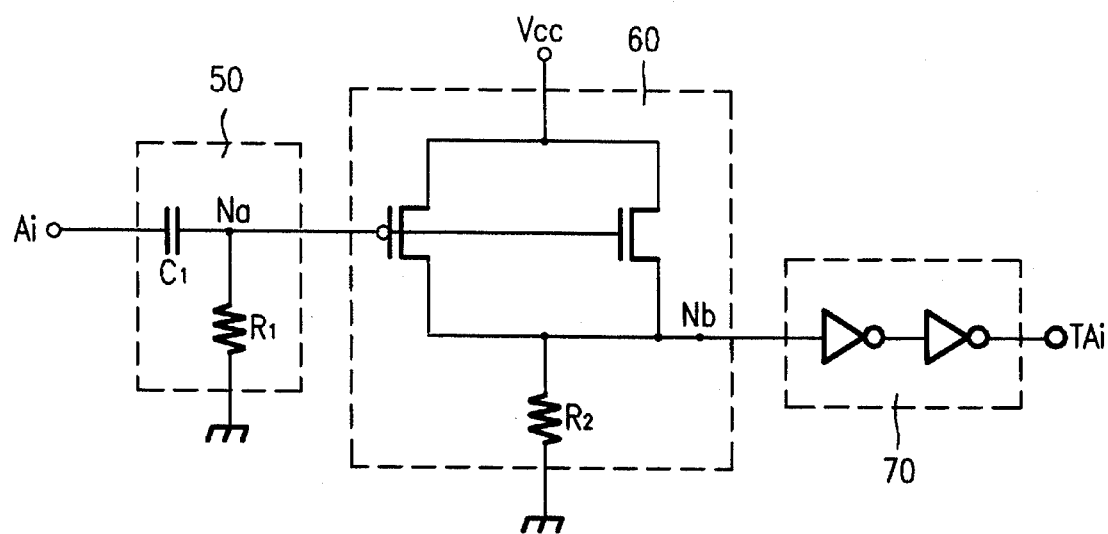
FIG. 6a
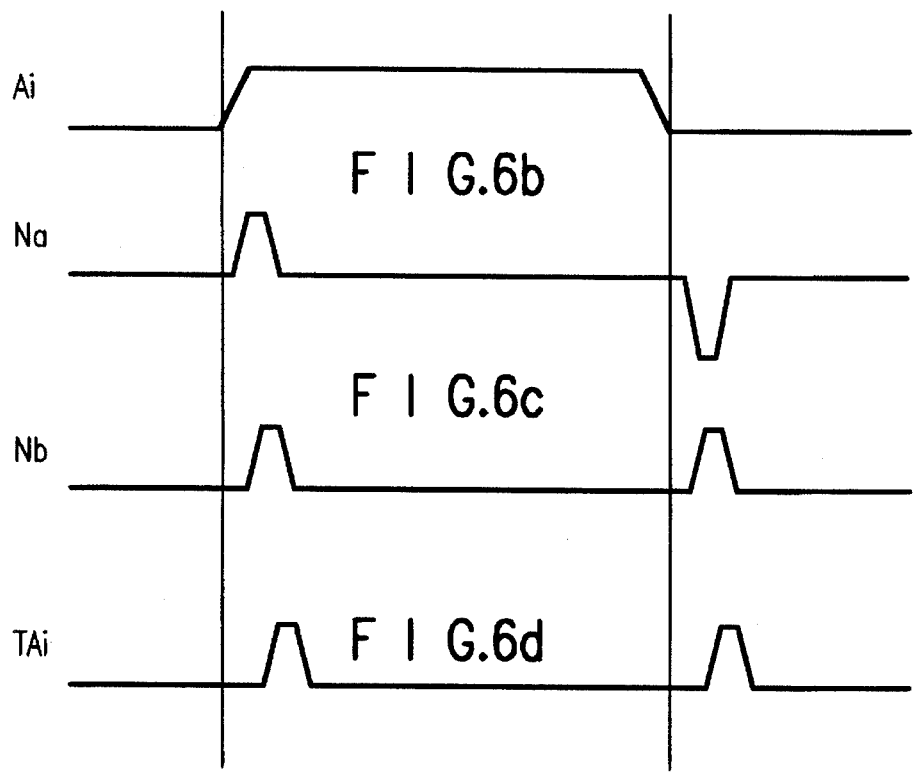
FIG. 6b
FIG. 6c
FIG. 6d

ADDRESS TRANSITION SIGNAL DETECTING CIRCUIT

BACKGROUND OF THE INVENTION

The present invention relates to an address transition signal detecting circuit, and more particularly, to an address transition signal detecting circuit for facilitating the detection of an address transition signal in a high-density semiconductor memory device.

FIG. 1 is a block diagram of a conventional address transition signal detecting circuit. Referring to FIG. 1, the conventional address transition signal detecting circuit has a derivative signal generator 10, and an address transition pulse signal detector/generator 20.

Derivative signal generator 10 makes and generates derivative signals Ai'D, Ai' and AiD from an input address signal Ai.

Address transition pulse signal detector/generator 20 receives and combines the derivative signals, producing an address transition signal.

FIG. 2 is a circuit diagram of the conventional address transition signal detecting circuit. FIG. 3 shows waveforms of signals processed in the conventional address transition signal detecting circuit.

The operation of the conventional address transition signal detecting circuit will be discussed with reference to FIGS. 2 and 3.

When address input signal Ai is input to derivative signal generator 10, this signal is inverted and delayed in the derivative signal generator to become a signal Ai'D. Then, a signal Ai' in which the phase of address input signal Ai is inverted is obtained. In addition, a signal AiD in which address input signal Ai is delayed is obtained. These are all input to address transition pulse signal detector/generator 20.

Derivative signals Ai'D, Ai' and AiD input to address transition pulse signal detector/generator 20 are logically combined with the original address input signal, forming an address transition signal.

Referring to FIG. 3 in more detail, when the waveform of signal Ai'D in which address input signal Ai is inverted and delayed, and the waveform of signal AI' in which address input signal Ai is inverted are "1" at the same time, the waveform of address transition signal TAi becomes "0."

When inverted signal AI' and delayed signal AiD both are "0," output waveform TAi becomes "1." When the original address input signal Ai and delayed signal AiD both are "1," output waveform TAi becomes "0."

When the original address input signal Ai and inverted and delayed signal Ai'D both are "0," output waveform TAi becomes "1."

When inverted and delayed signal Ai'D and inverted signal Ai' both are "1," output waveform TAi becomes "0."

With a large number of switching devices (for instance, 14 MOSFETs) used, the conventional address transition signal detecting circuit increases the integration of semiconductor memory, raising the number of derivative signals.

Accordingly, this involves the increase of the switching device floating capacitance, causing a problem so serious as to affect the operation, especially the speed, of a semiconductor memory device.

SUMMARY OF THE INVENTION

Therefore, it is an object of the present invention to provide an address transition signal detecting circuit in which the number of circuit devices is sharply reduced to decrease floating capacitance and to improve the response speed of the circuit.

It is another object of the present invention to provide an address transition signal detecting circuit in which the domain of a chip is reduced due to the decreased number of switching devices.

It is still another object of the present invention to provide an address transition signal detecting circuit in which noise is reduced during circuit operation due to the reduction of derivative signals.

To accomplish the objects of the present invention, there is provided an address transition signal detecting circuit including a differentiator for receiving and differentiating an address input signal and a pulse signal, and a pulse signal forming portion for receiving the signal differentiated in the differentiator to thereby form an address transition signal.

BRIEF DESCRIPTION OF THE DRAWINGS

FIG. 5 is a circuit diagram of an address transition signal detecting circuit of the present invention; and FIGS. 6a–6d are diagrams of waveforms processed in the address transition signal detecting circuit of the present invention.

DETAILED DESCRIPTION OF THE INVENTION

Hereinafter, a preferred embodiment of the present invention will be described with reference to the attached drawings.

Figure 1:
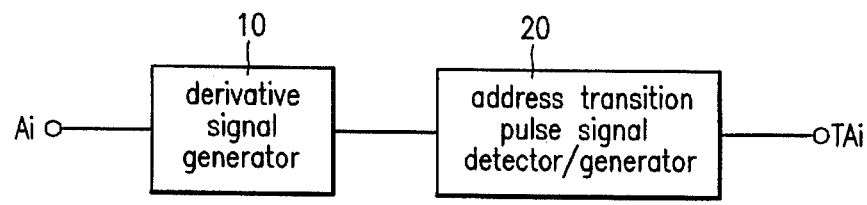
FIG. 1 is a block diagram of a conventional address transition signal detecting circuit.
Figure 2:
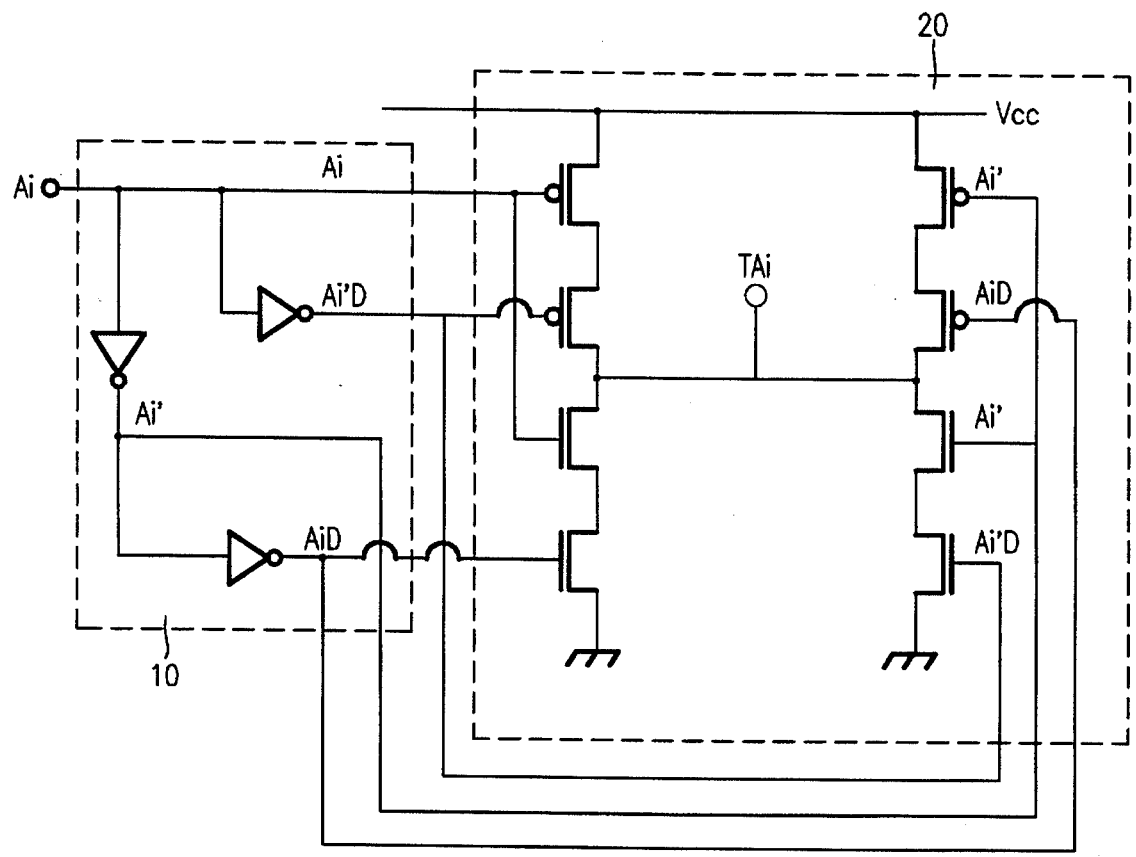
FIG. 2 is a circuit diagram of the conventional address transition signal detecting circuit.
Figure 3:
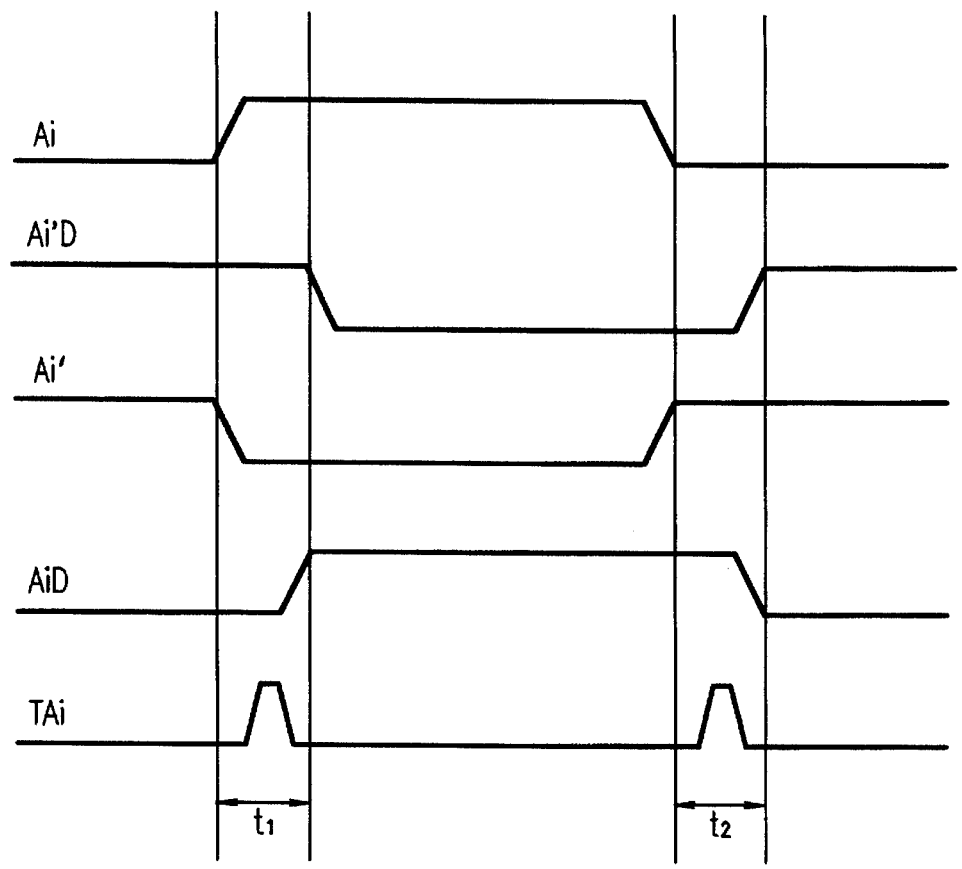
FIG. 3 depicts diagrams of waveforms processed in the conventional address transition signal detecting circuit.
Figure 4:
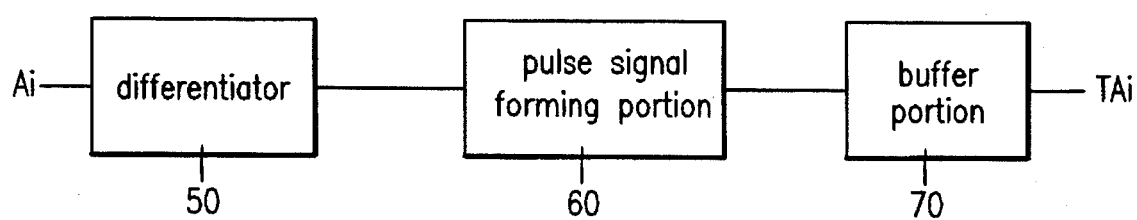
FIG. 4 is a block diagram of an address transition signal detecting circuit of the present invention.

Referring to FIG. 4, the address transition signal detecting circuit of the present invention comprises a differentiator 50, a pulse signal forming portion 60 and a buffer portion 70.

Differentiator 50 receives an address input signal Ai and differentiates it. Pulse signal forming portion 60 receives the signal differentiated in differentiator 50, and forms an address transition signal. Buffer portion 70 increases the fan-out of address transition signal TAi formed in pulse signal forming portion 60.

Differentiator 50 is made by serially connecting a condenser $C_1$ and a grounded resistor $R_1$. Pulse signal forming portion 60 is constructed so that grounded resistor $R_2$ is connected to a parallel-connected P-channel MOSFET and an N-channel MOSFET and so that a predetermined voltage Vcc is coupled to the sources of the P-channel MOSFET and N-channel MOSFET. Buffer portion 70 is made by serially connecting two buffers.

The operation of the present invention will be described in more detail with reference to FIGS. 4–6.

When address input signal Ai is input to differentiator 50, the signal is differentiated by the following transfer function $$\frac{R}{R+\frac{1}{jwC}} = \frac{jwRC}{jwRC+1}$$

where $jwRC \gg 1$. In the transition, a pulse signal is obtained. This differentiated pulse signal has a signal waveform as shown in FIG. 6b, at node Na.

The signal differentiated in differentiator 50 is input to pulse signal forming portion 60, and formed into the address transition signal.

The address transition signal formed in pulse signal forming portion 60 is obtained as shown in FIG. 6c, at node Nb.

The address transition signal output from pulse signal forming portion 60 is input to buffer portion 70 and increased in fan-out. Then, the signal is output as shown in FIG. 6d.

As described above, the present invention decreases floating capacitance due to the reduced number of switching devices, improving the response speed of a circuit. In addition, the domain of a chip is reduced and the number of derivative signals is also reduced to alleviate noise at circuit operation.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An address transition signal detecting circuit comprising:

a differentiator for receiving and differentiating an address input signal; and a pulse signal forming portion for receiving the signal differentiated in the differentiator to thereby form an address transition signal;

wherein the pulse signal forming portion comprises a grounded resistor connected to a parallel-connected P-channel MOSFET and N-channel MOSFET, each of the P-channel MOSFET and N-channel MOSFET having a source, and a predetermined voltage is coupled to the sources of the P-channel MOSFET and the N-channel MOSFET.

2. An address transition signal detecting circuit as in claim 1, wherein the differentiator comprises a serially-connected condenser and grounded resistor.

3. A method of processing a signal for use in an address transition detection, the method comprising the steps of:

receiving an input signal;

differentiating the input signal;

receiving the differentiated signal including using a P-channel MOSFET; and forming an output signal using the differentiated signal.

4. A method of processing a signal as in claim 3, wherein the input signal gives indication on address.

5. A method of processing a signal as in claim 3, wherein the step of differentiating further comprises a step of passing the input signal through circuitry including a condenser and a resistor.

6. A method of processing a signal as in claim 3, wherein the output signal gives indication on address transition.

7. A method of processing a signal as in claim 3, wherein the output signal is of pulse form.

8. A method of processing a signal as in claim 3, wherein the step of forming an output signal further comprises using a buffer.

9. A method of processing a signal as in claim 3, wherein the step of receiving a differentiated signal further comprises using a plurality of switching devices.

10. A method of processing a signal for use in an address transition detection, the method comprising the steps of:

receiving an input signal;

differentiating the input signal;

receiving the differentiated signal including using an N-channel MOSFET; and forming an output signal using the differentiated signal.

11. A method of processing a signal as in claim 10, wherein the input signal gives indication on address.

12. A method of processing a signal as in claim 10, wherein the step of differentiating further comprises a step of passing the input signal through circuitry including a condenser and a resistor.

13. A method of processing a signal as in claim 10, wherein the output signal gives indication on address transition.

14. A method of processing a signal as in claim 10, wherein the output signal is of pulse form.

15. A method of processing a signal as in claim 10, wherein the step of forming an output signal further comprises using a buffer.

16. A method of processing a signal as in claim 10, wherein the step of receiving a differentiated signal further comprises using a plurality of switching devices.

17. A signal processing apparatus for detection of address signals, the apparatus comprising:

a differentiator which may receive an input signal; and a signal former for receiving signals from the differentiator thereby to form an output signal;

wherein the signal former comprises a P-channel MOSFET and a N-channel MOSFET.

18. A signal processing apparatus as in claim 17, wherein at least part of the apparatus is contained in a chip.

19. A signal processing apparatus as in claim 18, wherein the input signal is an address signal.

20. A signal processing apparatus as in claim 19, wherein the output signal is an address transition signal.

* * * * *